(12) United States Patent
Schreck et al.

(10) Patent No.: US 11,264,096 B2
(45) Date of Patent: Mar. 1, 2022

(54) APPARATUSES, SYSTEMS, AND METHODS FOR A CONTENT ADDRESSABLE MEMORY CELL WITH LATCH AND COMPARATOR CIRCUITS

(71) Applicant: MICRON TECHNOLOGY, INC., Boise, ID (US)

(72) Inventors: John Schreck, Lucas, TX (US); Dan Penney, Wylie, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/411,573

(22) Filed: May 14, 2019

(65) Prior Publication Data

US 2020/0365208 A1     Nov. 19, 2020

(51) Int. Cl.
| | | |
|---|---|---|
| *G11C 15/04* | (2006.01) |
| *G11C 16/28* | (2006.01) |
| *G11C 11/406* | (2006.01) |
| *G11C 11/4074* | (2006.01) |
| *G11C 11/408* | (2006.01) |
| *G11C 11/4096* | (2006.01) |
| *G11C 11/419* | (2006.01) |
| *G11C 11/4094* | (2006.01) |

(52) U.S. Cl.
CPC ........ *G11C 15/043* (2013.01); *G11C 11/4074* (2013.01); *G11C 11/4085* (2013.01); *G11C 11/4094* (2013.01); *G11C 11/4096* (2013.01); *G11C 11/40611* (2013.01); *G11C 11/419* (2013.01); *G11C 16/28* (2013.01)

(58) Field of Classification Search
CPC ............. G11C 15/043; G11C 11/4074; G11C 11/4096; G11C 11/4085; G11C 11/40611; G11C 11/4094
See application file for complete search history.

(56) References Cited

U.S. PATENT DOCUMENTS

| | | |
|---|---|---|
| 1,158,364 A | 10/1915 | Bibb |
| 3,633,175 A | 1/1972 | Harper |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

U.S. Appl. No. 16/546,152 titled "Apparatuses and Methods for Analog Row Access Tracking" filed Aug. 20, 2019.

(Continued)

*Primary Examiner* — Sultana Begum
(74) *Attorney, Agent, or Firm* — Dorsey & Whitney LLP

(57) ABSTRACT

Embodiments of the disclosure are drawn to apparatuses and methods for content addressable memory (CAM) cells. Each CAM cell may include a comparator portion which stores a bit of information. Each CAM cell may also include a comparator portion, which compares an external bit to the stored bit. A group of CAM cells may be organized into a CAM register, with each CAM cell coupled in common to a signal line. Any of the CAM cells may change a voltage on the signal line if the external bit does not match the stored bit.

7 Claims, 8 Drawing Sheets

(56) References Cited

U.S. PATENT DOCUMENTS

| | | |
|---|---|---|
| 5,291,198 A * | 3/1994 | Dingwall .............. H03M 1/204 341/156 |
| 5,299,159 A | 3/1994 | Balistreri et al. |
| 5,422,850 A | 6/1995 | Sukegawa et al. |
| 5,638,317 A * | 6/1997 | Tran .................... G11C 7/10 365/189.05 |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 * | 6/2020 | Hirashima ............. G11C 16/28 |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,043,254 B2 | 6/2021 | Enomoto et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |

(56) References Cited

U.S. PATENT DOCUMENTS

| | | |
|---|---|---|
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1* | 3/2011 | Kushida ............... G11C 11/413 365/189.05 |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1* | 9/2014 | Yang ..................... G11C 11/419 365/154 |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0355332 A1 | 12/2014 | Youn et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |

(56) References Cited

U.S. PATENT DOCUMENTS

| | | |
|---|---|---|
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| KR | 1020180064940 A | 6/2018 |
| KR | 1020180085184 A | 7/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |

OTHER PUBLICATIONS

U.S. Appl. No. 16/548,027 titled "Apparatuses, Systems, and Methods for Analog Row Access Rate Determination" filed Aug. 22, 2019.

U.S. Appl. No. 16/549,942 titled "Apparatuses and Methods for Lossy Row Access Counting" filed Aug. 23, 2019.

U.S. Appl. No. 16/425,525 titled "Apparatuses and Methods for Tracking All Row Accesses" filed May 29, 2019.

U.S. Appl. No. 16/427,105 titled "Apparatuses and Methods for Priority Targeted Refresh Operations" filed May 30, 2019.

U.S. Appl. No. 16/427,140 titled "Apparatuses and Methods for Tracking Row Access Counts Between Multiple Register Stacks" filed May 30, 2019.

U.S. Appl. No. 16/437,811 titled "Apparatuses, Systems, and Methods for Determining Extremum Numerical Values" filed Jun. 11, 2019.

U.S. Appl. No. 16/411,698 title "Semiconductor Device" filed May 14, 2019.

U.S. Appl. No. 16/427,330 titled "Apparatuses and Methods for Storing Victim Row Data" filed May 30, 2019.

U.S. Appl. No. 16/428,625 titled "Apparatuses and Methods for Tracking Victim Rows" filed May 31, 2019.

U.S. Appl. No. 16/459,520 titled "Apparatuses and Methods for Monitoring Word Line Accesses", filed Jul. 1, 2019, pp. all.

U.S. Appl. No. 16/797,658, titles "Apparatuses and Methods for Controlling Refresh Operations", filed Feb. 21, 2020.

U.S. Appl. No. 16/513,400 titled "Apparatuses and Methods for Tracking Row Accesses" filed Jul. 16, 2019.

(56) References Cited

OTHER PUBLICATIONS

U.S. Appl. No. 16/805,197, titled "Apparatuses and Methods for Calculating Row Hammer Refresh Addresses in a Semiconductor Device", filed Feb. 28, 2020.
U.S. Appl. No. 15/881,256 entitled 'Apparatuses and Methods for Detecting a Row Hammer Attack With a Bandpass Filter' filed Jan. 26, 2018.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/176,932, titled "Apparatuses and Methods for Access Based Refresh Timing", filed Oct. 31, 2018.
U.S. Appl. No. 16/237,291, titled "Apparatus and Methods for Refreshing Memory", filed Dec. 31, 2018.
U.S. Appl. No. 16/268,818, titled "Apparatuses and Methods for Managing Row Access Counts", filed Feb. 6, 2019.
U.S. Appl. No. 16/358,587, titled "Semiconductor Device Having Cam That Stores Address Signals", dated Mar. 19, 2019.
U.S. Appl. No. 15/876,566 entitled 'Apparatuses and Methods for Calculating Row Hammer Refresh Addresses in a Semiconductor Device' filed Jan. 22, 2018.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017 pp. all.
U.S. Appl. No. 15/281,818, entitled: "Semiconductor Device" filed Sep. 30, 2016.
Kim, et al., "Flipping Bits in MemoryWithout Accessing Them: An Experimental Study of DRAM Disturbance Errors", IEEE, Jun. 2014, 12 pgs.
U.S. Appl. No. 15/884,192 entitled 'Semiconductor Device Performing Row Hammer Refresh Operation' filed Jan. 30, 2018.
U.S. Appl. No. 16/936,297 titled "Apparatuses and Methods for Managing Row Access Counts" filed Jul. 22, 2020.
Thomas, et al., "Voltage Source Based Voltage-to-Time Converter", IEEE, 2020, p. all.
U.S. Appl. No. 17/102,266, titled "Apparatuses and Methods for Tracking Word Line Accesses", dated Nov. 23, 2020.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semeconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018; pp. all.
U.S. Appl. No. 16/783,063, titled "Apparatus and Methods for Triggering Row Hammer Address Sampling", dated Feb. 5, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titlad "Semeconductor Device Performing Row Hammer Refresh Operation", dated Mar. 13, 2020, pp. all.
U.S. Appl. No. 16/286,187 titled "Apparatuses and Methods for Memory Mat Refresh Sequencing" filed on Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods Foraccess Based Refresh Timing" filed May 28, 2020, pp. all.
U.S. Appl. No. 16/886,284, titled "Apparatuses and Methods for Access Bases Refresh Timing", dated May 28, 2020, pp. all.
U.S. Appl. No. 16/375,716 titled "Apparatuses and Methods For Staggered Timing of Targeted Refresh Operations" filed Apr. 4, 2019; pp. all.
U.S. Appl. No. 17/060,403 titled "Apparatuses and Methods for adjusting Victim Data" filed Oct. 1, 2020, pp. all.
U.S. Appl. No. 16/549,411 titled "Apparatuses and Methods for Dynamic Refresh Allocation" filed Aug. 23, 2019, pp. all.
U.S. Appl. No. 15/655,110 titled "Apparatuses and Methods for Dynamic Targeted Refresh Steals" filed Oct. 13 2019, pp. all.
International Application No. PCT/US19/40169 titled "Apparatus and Methods for Triggering Row Hammer Address Sampling" filed Jul. 1, 2019, pp. all.
International Application No. PCT/US19/64028; titled "Semiconductor Device Performeng Row Hammer Refresh Operation", dated Dec. 2, 2019, pp. all.
International Application No. PCT/US20/26689, titled "Apparatuses and Methods for Staggered Teming of Targeted Refresh Operations", dated Apr. 3, 2020, pp. all.
U.S. Appl. No. 16/788,657, titled "Semiconductor Device Performing Row Hammer Refresh Operation", dated Feb. 12, 2020; pp. all.
U.S. Appl. No. 16/537,981 titled "Apparatuses and Methods for Controlling Targeted Refresh Rates" filed Aug. 12, 2019, pp. all.
U.S. Appl. No. 17/153,555 titled "Apparatuses and Methods for Dynamecally Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021.
U.S. Appl. No. 17/301,533 titled "Semiconductor Device Having Cam That Stores Address Signals" filed Apr. 6, 2021, pp. all.
U.S. Appl. No. 15/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018; pp. all.
U.S. Appl. No. 16/290,730, titled "Semiconductor Device Performing Row Hammer Refresh Operation", filed Mar. 1, 2019, pp. all.
U.S. Appl. No. 16/374.623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates" filed Jun. 4, 2019, pp. all.
U.S. Appl. No. 16/682,605, titled "Apparatuses and Methods For Distributmg Row Hammer Refresh Events Across A Memory Device", filed Nov. 13, 2019, pp. all.
U.S. Appl. No. 16/459,507 titled "Apparatuses and Methods for Adjusting Victim Data", filed Jul. 1, 2019, pp. all.
U.S. Appl. No. 17/007,069 titled "Apparatuses and Methods for Providing Refresh Addresses" filed Aug. 31, 2020, pp. all.
U.S. Appl. No. 17/375,817 titled "Apparatuses and Methods for Monitoring Word Line Accesses" filed Jul. 14, 2021, pp. all.
U.S. Appl. No. 17/443,056 titled "Apparatuses and Methods for Multiple Row Hammer Refresh Address Sequences" filed Jul. 20, 2021, pp. all.
U.S. Appl. No. 17/444,925 titled "Apparatuses and Methods for Countering Memory Attacks" filed Aug. 12, 2021, pp. all.
U.S. Appl. No. 17/446,710 titled "Apparatuses, Systems, and Methods for Determining Extremum Numericalvalues" filed Sep. 1, 2021, pp. all.
U.S. Appl. No. 17/470,883 titled "Apparatuses and Methods for Tracking Victim Rows" filed Sep. 9, 2021, pp. all pages of appiication as filed.
U.S. Appl. No. 17/456,849 titled "Apparatuses, Systems, and Methods for Main Sketch and Slim Sketch Circuitfor row Address Tracking" filed Nov. 9, 2021.
U.S. Appl. No. 17/565,119 titled "Apparatuses and Methods for row Hammer Counter mat" filed Dec. 29, 2021.
U.S. Appl. No. 17/565,187 titled "Apparatuses and Methods for row Hammer Counter mat" filed Dec. 29, 2021.

\* cited by examiner

APPARATUSES, SYSTEMS, AND METHODS FOR A CONTENT ADDRESSABLE MEMORY CELL WITH LATCH AND COMPARATOR CIRCUITS

BACKGROUND

This disclosure relates generally to semiconductor devices, and more specifically to semiconductor components used for storing bits. Semiconductor logic devices may generally operate with a binary logic, where signals and information are stored as one or more bits, each of which may be at a high logical level or a low logical level. There may be a number of applications where it is useful to store information and compare the stored information with external information. For example, a memory device may use a string of bits as a row address to refer to a particular group of memory cells. One or more row addresses may be stored, and may be compared to incoming row addresses to determine if there is a match between any of the stored row addresses and the incoming row address.

DETAILED DESCRIPTION

Figure 1:
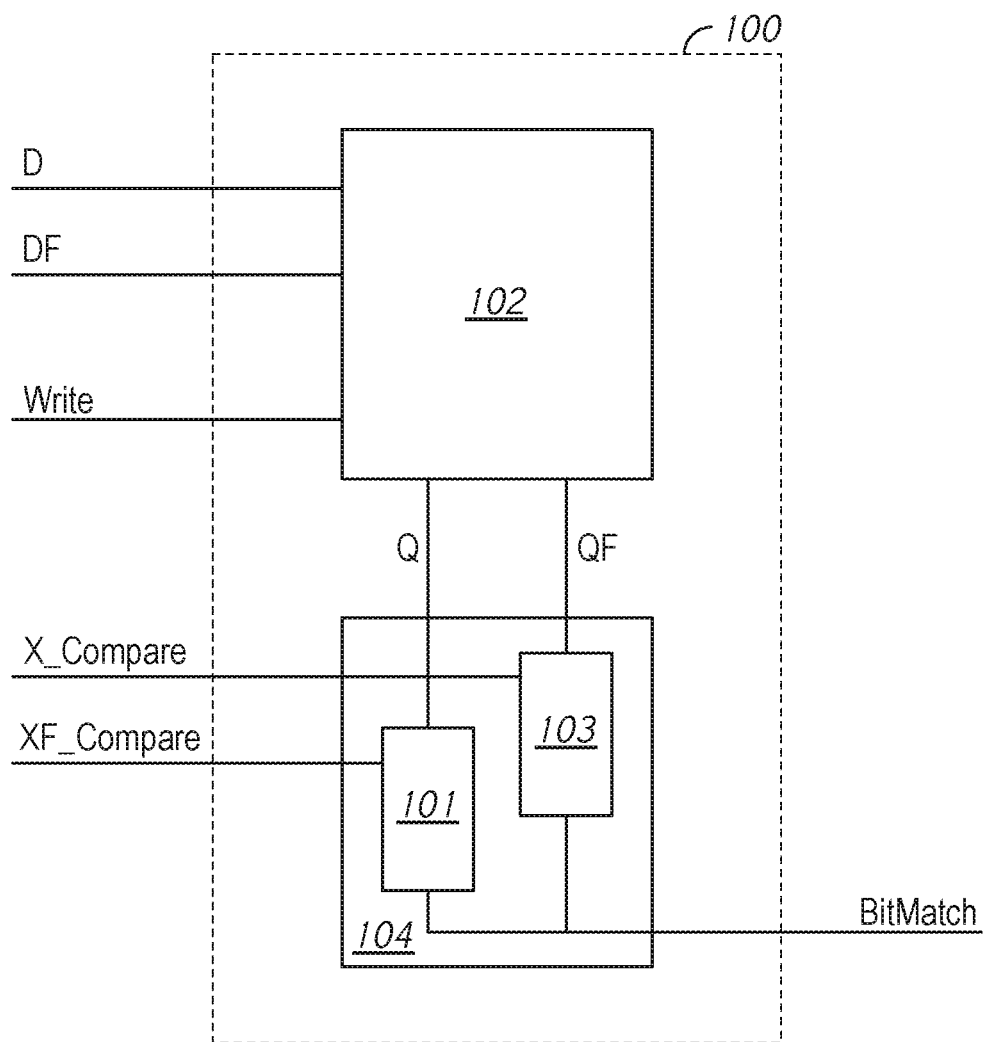
FIG. 1 is a block diagram of a content addressable memory (CAM) cell according to the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a semiconductor device may generally be represented by one or more binary bits, with each bit being at a high logical level (e.g., 1) or a low logical level (e.g., 0). Information may be stored in circuits included in the semiconductor device, such as latch circuits. The latch circuits may store a particular bit of information, which may later be retrieved and/or overwritten by a new bit of information to be stored. A group of latch circuits may be organized together to form a register, which stores information (e.g., data) including a number of bits. A number of registers may be organized into a stack, to store multiple pieces of information (e.g., each register may have N latch circuits to store information including N bits, and there may be M registers in the stack). The number of registers in a stack may generally be referred to as a depth of the stack. There may be many applications where it is useful to be able to search a given register stack for the register containing particular information, however such circuits may be relatively space and power consuming.

The present disclosure is drawn to apparatuses, systems, and methods for a content addressable memory cell. In some embodiments of the disclosure, a content addressable memory (CAM) cell may store a bit of information and allow for the memory cell to be addressed (e.g., located within a group of CAM cells) based on the contents stored in the CAM cell. A CAM cell of the present disclosure includes a layout which may allow for each CAM cell to take up relatively little space on a semiconductor device (e.g., by using fewer components and/or smaller components), and may also allow for less power to be drawn when addressing the CAM cells.

A CAM cell according to some embodiments of the present disclosure include a latch portion and a comparator portion. In such embodiments, the latch portion may store a bit of information, while the comparator portion may compare the stored bit to a supplied external bit. If the comparator portion determines that there is not a match, the state of a match signal may be changed from a high logical level to a low logical level. If there is a match, the comparator portion may do nothing and the latch signal may remain at a high logical level. When multiple CAM cells are organized into a register, they may be coupled in common to a signal line and may share a latch signal.

FIG. 1 is a block diagram of a content addressable memory (CAM) cell according to an embodiment of the present disclosure. The CAM cell 100 includes a latch portion 102 and a comparator portion 106.

The latch portion 102 stores a bit and provides signals Q and QF indicative of the logic level of the stored bit. The signals Q and QF may be binary signals, which are either at a high logical level (e.g., a first voltage) or a low logical level (e.g., a second voltage). The Q and QF signals are complementary to each other and have opposite logical values. For example, if the signal Q is a logical high, then the signal QF may be a logical low and vice versa. The signal Q may represent the logical level of the stored bit, while the signal QF may be complementary to the logical level of the stored bit. The latch portion 102 may continue to provide the signals Q and QF as long as the latch portion 102 is receiving power. In some embodiments, the latch portion 102 may receive power whenever the device containing the CAM cell 100 is powered on.

The CAM cell 100 may receive an input signal D and a complementary input signal DF. The input signals D and DF are complementary to each other and have opposite logical values. The input bit D may represent a logical value of an input bit which is provided to overwrite the stored bit currently in the CAM cell, When a write signal Write is at a high logical level, the value of the signals D and DF may be written to the CAM cell 100. This may cause the values of the input signals D and DF to overwrite the current values of the stored signals Q and QF, respectively. When the signal Write is at a low logical level, the values of the stored signals Q and QF may be maintained, even if the input signals D and DF are provided.

The CAM cell 100 may also include a comparator portion 104. The comparator portion 104 may be used when external signals X_Compare and XF_Compare are provided. The external signals X_Compare and XF_Compare are complementary to each other during a comparison operation. The signals X_Compare may represent the logical level of an external bit, while the signal XF_Compare may represent a complement to the logical level of the external bit. When a comparison operation is not being performed (e.g., when the signal X_Compare does not represent an external bit) both X_Compare and XF_Compare may be at a low logical level. The comparator portion 104 determines if the external signals X_Compare matches the stored signal Q, and if the complementary external signal XF_Compare matches the complementary stored signal QF. If the external signal X_Compare does not match the stored signal Q (and therefore the complementary external signal XF_Compare does not match the complementary stored signal QF), the comparator portion 104 may provide a BitMatch signal having a low logical level. In contrast, if the external signal X_Compare does match the stored signal Q (and therefore the inverse external signal XF_Compare matches the inverse stored signal QF), the comparator portion 104 may provide a BitMatch signal having a high logical level.

In some embodiments of the disclosure, before a comparison operation is performed (e.g., before X_Compare and XF_Compare are provided) the BitMatch signal may have a high logical level, Thus, if there is not a match between the external signals and the stored signals, the CAM cell 100 may change the state of the signal BitMatch to a low logical level. If the signals Q and X_Compare (and QF and XF_Compare) do match, the signal BitMatch may be left at a high logical level.

In some embodiments, the comparator portion 104 may include a first portion 101 and a second portion 103. Both the first portion 101 and the second portion 103 may be coupled to the signal BitMatch and either the first portion 101 or the second portion 103 may be capable of changing a logic level of the signal BitMatch. The first portion 101 may be activated when the signal XF_Compare is at a high logical level, and may be inactive otherwise. The second portion 103 may be activated when the signal X_Compare is at a high logical level. Since the signals X_Compare and XF_Compare are complementary to each other, only one of the first portion 101 or the second portion 103 may be active at a given time. When active, the first portion 101 may change the signal BitMatch from a high logical level to a low logical level if the signal Q is at a high level (e.g., if the signals Q and XF_Compare match). Similarly, when active, the second portion 102 may change the signal BitMatch from a high logical level to a low logical level if the signal QF is at a high logical level (e.g., if the signals QF and X_Compare match).

Figure 2:
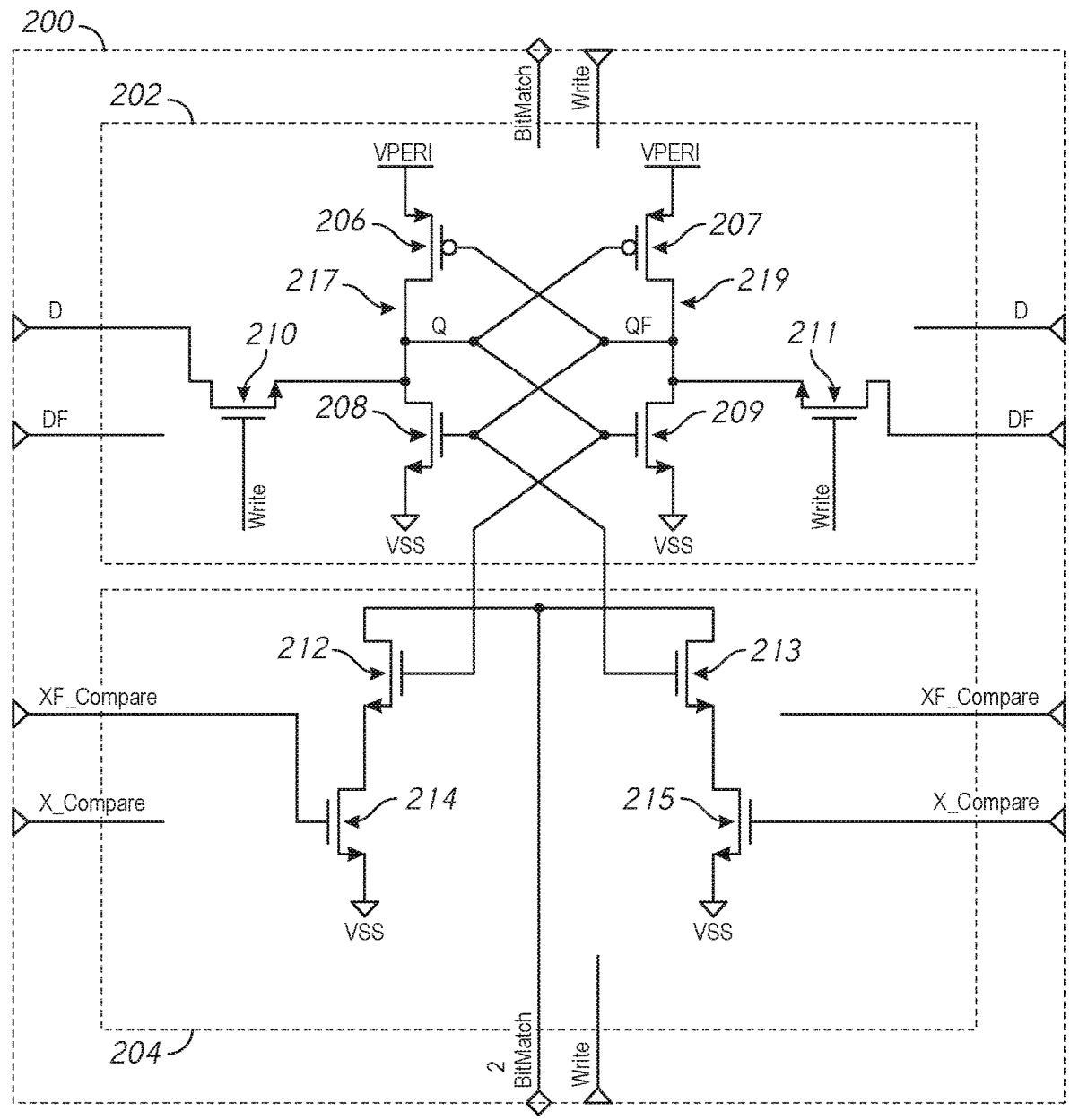
FIG. 2 is a schematic diagram of a CAM cell according to an embodiment of the present disclosure.

FIG. 2 is a schematic diagram of a CAM cell according to an embodiment of the present disclosure, The CAM cell 200 may, in some embodiments, implement the CAM cell 100 of FIG. 1. The CAM cell 200 includes a latch portion 202 and a comparator portion 204. The CAM cell 200 may generally use voltages to represent the values of various bits. The CAM cell 200 may include conductive elements (e.g., nodes, conductive lines) which carry a voltage representing a logical value of that bit. For example, a high logical level may be represented by a first voltage (e.g., a system voltage such as VPERI), while a low logical level may be represented by a second voltage (e.g., a ground voltage, such as VSS).

The latch portion 202 includes a first transistor 206 which has a source coupled to a node which provides a voltage VPERI, which may represent a high logical level. The first transistor 206 has a drain coupled to a node 217 having a voltage which represents the value of the signal Q and a gate coupled to a node 219 having a voltage which represents a value of the complementary signal QF. The signal Q represents the logical level of a bit stored in the latch portion 202. The first transistor 206 may be a p-type transistor. The latch portion 202 also includes a second transistor 207 which has a source coupled to the node which provides VPERI, a gate coupled to the node 217 and a drain coupled to the node 219. The second transistor 207 may be a p-type transistor.

The latch portion 202 includes a third transistor 208 which has a drain coupled to the node 217, a gate coupled to the node 219, and a source coupled to a node providing a ground voltage VSS, which may represent a low logical level. The third transistor 208 may be an n-type transistor. The latch portion 202 includes a fourth transistor 209 which has a drain coupled to the node 219, a gate coupled to the node 217, and a source coupled to the node providing the ground voltage VSS. The fourth transistor 209 may be an n-type transistor. The transistors 206 and 208 may form an inverter circuit and the transistors 207 and 209 may form another inverter circuit, and the two inverter circuits are cross-coupled to one another.

In operation, the first, second, third, and fourth transistors 206-209 may work to store the value of the stored signals Q and QF. The transistors 206-209 may work together to couple the node 217 carrying Q and the node 219 carrying QF to a node providing the system voltage (e.g., VPERI or VSS) associated with the value of the signals Q and QF. For example, if the stored signal Q is at a high logical level, then the inverse signal QF is at a low logical level. The first transistor 206 may be active, and VPERI may be inactive. The fourth transistor 209 may be active and may couple VSS to the node 219. This may keep the node 217 at a voltage of VPERI, which represents a high logical level, and the node 219 at a voltage of VSS, which represents a low logical level. In another example, if the stored signal Q is at a low logical level, then the inverse signal QF may be at a high logical level. The first transistor 206 and the fourth transistor 209 may both be inactive. The second transistor 207 may be active and may couple VPERI to the node 219. The third transistor 208 may also be active and may couple VSS to the node 217. In this manner, the stored signal Q and QF may be coupled to a respective system voltage corresponding to their current logical levels, which may maintain the current logical value of the stored bit.

The latch portion 202 also includes a fifth transistor 210 and a sixth transistor 211. The transistors 210 and 211 may act as switches which may couple a signal line which carries input data D and a signal line carrying inverse input data DF to the nodes 217 and 219 carrying Q and QF respectively when a write signal Write is active. The fifth transistor 210 has a gate coupled to a line carrying the Write signal, a drain coupled to the signal D, and a source coupled to the node 219. The sixth transistor 211 has a gate coupled to the Write signal, a drain coupled to the signal DF, and a source coupled to the node 219. Accordingly, when the Write signal is at a high level (e.g., at a voltage such as VPERI), the transistors 210 and 211 may be active, and the voltages of the signals D and DF may be coupled to the nodes 217 and 219 carrying Q and QF respectively.

In some embodiments, the first through sixth transistors 206-211 may generally all be the same size as each other. For example, the transistors 206-211 may have a gate width of about 300 nm. Other sizes of transistor 206-211 may be used in other examples. The CAM cell 200 also includes a comparator portion 204. The comparator portion 204 may compare the signals Q and QF to the signals X_Compare and XF_Compare. The signal X_Compare may represent a logical level of an external bit provided to the comparator portion 204. If there is not a match between the signals Q and X_Compare (and therefore between QF and XF_Compare), then the comparator portion 206 may change a state of from the BitMatch signal from a first logical level (e.g., a high logical level) to a second logical level (e.g., a low logical level). For example, if the stored and external bits do not match, the comparator portion 204 may couple the ground voltage VSS to a signal line carrying the signal BitMatch. In some embodiments, if there is a match between the stored and external bits, then the comparator portion 206 may do nothing. in some embodiments, the signal BitMatch may be precharged to a voltage associated with a high logical level (e.g., VPERI) before a comparison operation. During the precharge operation, both X_Compare and XF_Compare may be held at a low logical level.

The comparator portion includes a seventh transistor 212, an eighth transistors 213, a ninth transistor 214, and a tenth transistor 215. The seventh transistor 212 and the ninth transistor 214 may implement the first portion 101 of FIG. 1. The eighth transistor 213 and the tenth transistor 215 may implement the second portion 103 of FIG. 1. The seventh transistor 212 includes a drain coupled to the signal Bit-Match, a gate coupled to the node 217 (e.g., the signal Q), and a source coupled to a drain of the ninth transistor 214. The ninth transistor 214 also has a gate coupled to the signal XF_Compare and a source coupled to a signal line providing the ground voltage VSS.

The eighth transistor 213 has a drain coupled to the signal BitMatch, a gate coupled to the node 219 (e.g., the signal QF), and a source coupled to a drain of the tenth transistor 215. The tenth transistor has a gate coupled to the signal X_Compare and a source coupled to the ground voltage VSS.

Since the signal Q is complementary to the signal QF, the comparator portion 202. may operate by comparing the external signal X_Compare to the signal QF to see if they match, and the inverse external signal XF_Compare to the stored signal Q to see if they match. If they do match, it may indicate that the signal X_Compare does not match the signal Q and that the signal XF_Compare does not match the signal QF, and thus that the external bits do not match the associated stored bits.

The comparator portion 204 may use relatively few components, since it changes the signal BitMatch from a known state (e.g., a precharged high logical level) to a low logical level. Thus, it may not be necessary to include additional components (e.g., additional transistors) to change the logical level of the signal BitMatch from low to high, or from an unknown level to either low or high. The comparator portion 204 may take advantage of this to provide dynamic logic. For example, the comparator portion 204 has two portions (e.g., transistors 212/214 and transistors 214/215) either of which may couple the signal BitLine to the voltage VSS if there is not a match between the stored and external bit. Since only one of the portions is active at a time, only the state of the signal Q or QF needs to be checked by the active portion. Either of the portions is equally capable of changing the signal BitMatch to a low logical level.

In an example operation, if the stored signal Q is at a high logical level (and thus the signal QF is low) and the external signal X_Compare is also high (and the signal XF_Compare is low), then the external signals may match the stored signals, and the transistors 212 and 215 may be active while the transistors 214 and 213 are inactive. This may prevent the ground voltage VSS from being coupled to the signal BitMatch. If the signal X_Compare is low (e.g., if there is not a match), then the external signals may not match the stored signals, and the transistors 212 and 214 may be active wile transistors 213 and 215 are inactive. The transistors 212 and 214 being active at the same time may couple the ground voltage VSS to the signal BitMatch.

In another example operation if the stored signal Q is low (and thus the signal QF is high) then the transistor 212 may be inactive while the transistor 213 is active. If the external signal X_Compare is low (and XF_Compare is high) then the external signal may match the stored bits, and the transistor 214 is active while transistor 215 is inactive. If the signal X_Compare is high (and the signal XF_Compare is low) then the external signal may not match the stored signal and the transistor 214 may be inactive while the transistor 215 is active. Accordingly, the signal BitMatch may be coupled to ground voltage VSS through active transistors 213 and 215.

In some embodiments, the transistors 212-215 of the comparator portion 204 may generally all have the same size to each other, in some embodiments, the transistors 212-215 of the comparator portion 204 may be a different size than the transistors 206-211 of the latch portions 202. For example, the transistors 212-215 may have a gate width of about 400 nm and a gate length of about 45 nm. Other sizes for the transistors 212-215 may be used in other examples.

Figure 3:
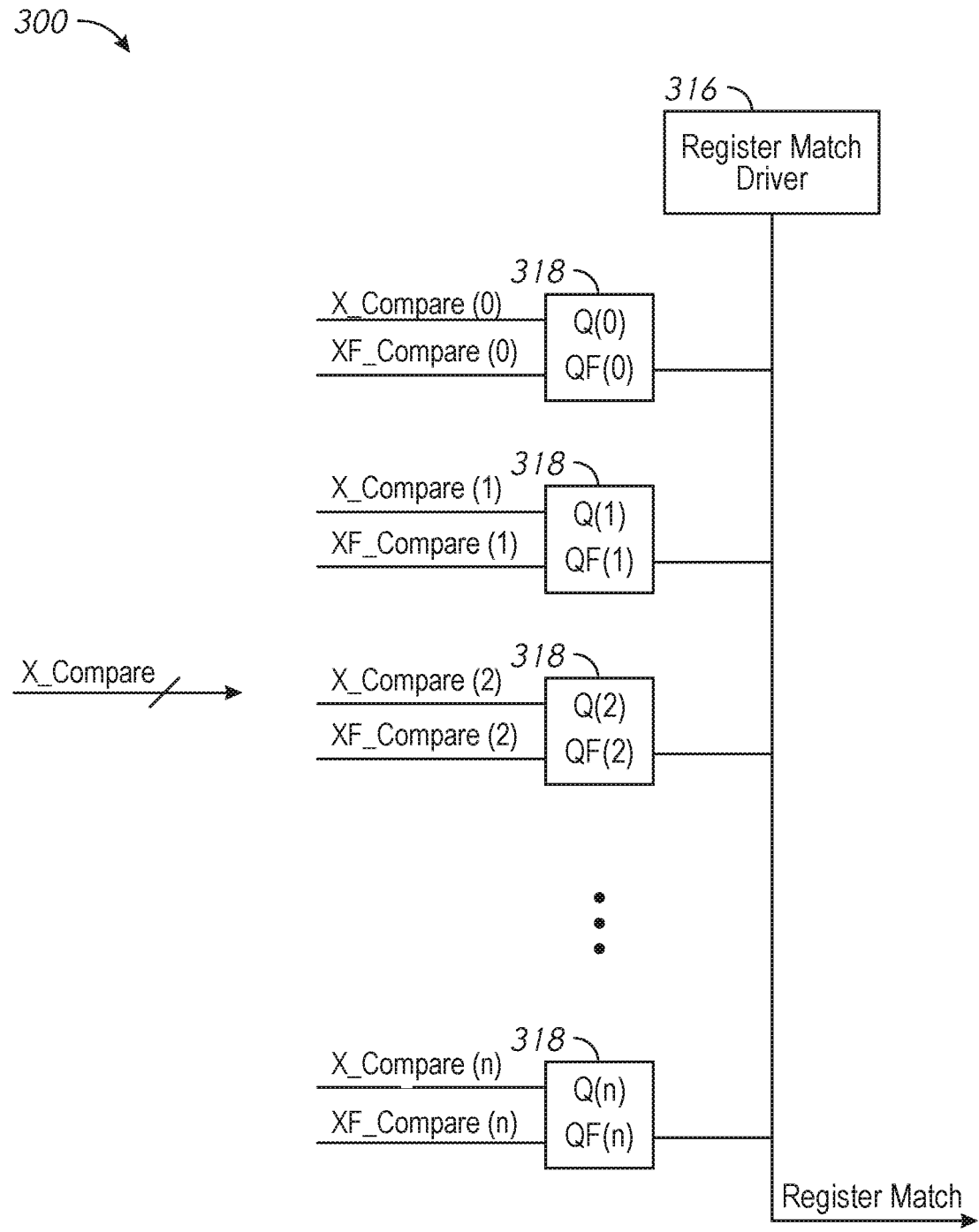
FIG. 3 is a block diagram of CAM cell register according to an embodiment of the present disclosure.

FIG. 3 is a block diagram of CAM cell register according to an embodiment of the present disclosure. The CAM cell register 300 includes a plurality of CAM cells 318(0)-318(n), each of which may be the CAM cell 100 of FIG. 1 and/or 200 of FIG. 2. The CAM cell register 300 may store multiple bits of information (e.g., stored bits Q(0) to Q(n)). The CAM cells 318 of the CAM cell register 300 may be coupled in common to a signal line that provides the signal Register-Match, which has voltage that represents a match bit with a logical state based on a comparison between the information stored across the CAM cells 318 of the CAM cell register 300 and an external signal X_Compare.

The CAM cell register 300 includes of a number of individual CAM cells 318, each of which may store a bit of information and provide signals Q and QF, where the signal QF has a complementary logic level of the signal Q. The signal Q may have a logic level which matches the logic level of the stored bit. The CAM cell register 300 may include a number of CAM cells 318 to hold multi-bit information. For example, the CAM cell register 300 may hold a row address which may be n bits long, and thus there may be n different CAM cells 318. The bits may be loaded into the CAM register 300 using the input terminals (e.g., which may receive the input signals D and DF of FIGS. 1-2) and a write signal (e.g., the signal Write of FIGS. 1-2), not shown here. A first bit of information Q(0) may be loaded into the first CAM cell 318(0), a second bit of information Q(2) into the second CAM cell 318(1), etc. In some embodiments, the input data D(0)-(n) may be provided along with a complementary input data DF(0)-(n). In some embodiments, only the input data D(0)-(n) may be provided, and one or more inverter circuits may be used to generate the complementary data DF(0)-(n) and provide it to the respective CAM cells 318.

During a comparison operation, data X_Compare may be provided to the CAM cell register 300. The data X_Compare may be the same type of information (e.g., a row address) as the information stored in the CAM cell register 300. The data X_Compare may be a multi-bit signal, and may have n bits to match the number of CAM cells 318 of the CAM cell register 300. When the data X_Compare is provided, it may be split into different individual bits and provided to an associated CAM cell 318. Thus a first external bit X_Compare(0) may be provided to the CAM cell 318(0) containing the stored bit Q(0), a second external bit X_Compare(1) may be provided to the CAM cell 318(1) containing the stored bit Q(1), etc. in some embodiments, the external data X_Compare may be provided along with complementary data XF_Compare. In some embodiments, only the data X_Compare may be provided, and one or more inverter circuits may be used to produce the complementary data XF_Compare and provide it to the CAM cells 318 of the CAM cell register 318.

Each of the CAM cells 318 may be coupled in common to a signal line that provides the signal RegisterMatch. The signal RegisterMatch may implement the signal BitMatch of FIGS. 1-2. The signal RegisterMatch may be coupled to a RegisterMatch driver 316. The RegisterMatch driver 316 may pre-charge a voltage of the signal RegisterMatch to a first voltage which represents a high logical level. In some embodiments, the RegisterMatch driver 316 may pre-charge the voltage of RegisterMatch to the first voltage each time that external signal X_Compare is provided. Any of the CAM cells 318 may couple the signal RegisterMatch to a second voltage which represents a low logical level (e.g., a ground voltage) if the stored signal Q(i) in the memory cell 318 does not match the associated external signal X_Compare(i). As previously described, the stored signal Q(i) may be compared to the external signal X_Compare(i) and the complementary stored signal QF(i) may be compared to the complementary external signal XF_Compare(i). In some embodiments, the signal RegisterMatch may be coupled to the second voltage if the stored signal Q(i) matches the complementary external signal XF_Compare(i) or the complementary stored signal QF(i) matches the external signal X_Compare(i).

Accordingly, the signal RegisterMatch will only remain at a first voltage (e.g., a high logical level) if every bit of the external signals X_Compare matches each of the associated stored signals Q. In other words, RegisterMatch may act as if each of the CAM cells 318 provided a match signal (e.g., BitMatch of FIGS. 1-2) which are provided as inputs to an AND gate which then provides the signal RegisterMatch.

Figure 4:
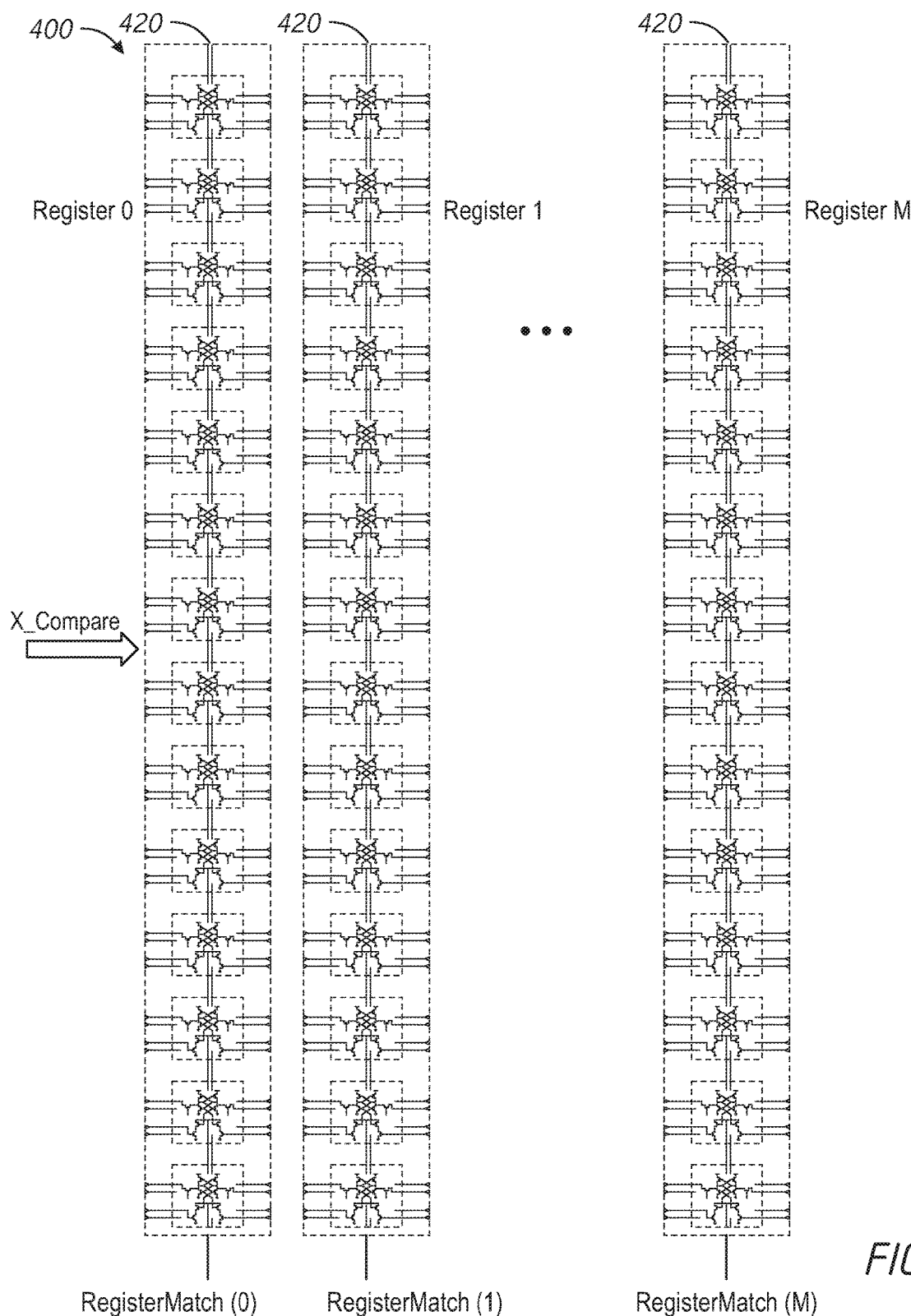
FIG. 4 is a block diagram showing a register stack according to an embodiment of the present disclosure.

FIG. 4 is a block diagram showing a register stack according to an embodiment of the present disclosure. The register stack 400 includes a number of CAM cell registers 420, each of which may be the CAM cell register 300 of FIG. 3. There may be m different CAM cell registers 420 in the stack (e.g., the stack may be in deep). Each of the CAM cell registers 420 may be coupled to a respective signal line RegisterMatch (e.g., RegisterMatch(0-m)).

During a search operation, external information X_Compare may be provided to each of the CAM cell registers 420. The external information X_Compare may be provided in common to the CAM cell registers 420, and may act as the external information X_Compare of FIG. 3. The information X_Compare may be a multi-bit signal, and each of the CAM cell registers 420 may have a same number of individual CAM cells (e.g., 100 of FIG. 1) as the number of bits in X_Compare. Each of the CAM cell registers 420, Register 0 to Register m, is coupled to a respective signal line RegisterMatch(0) to RegisterMatch(m). Each of the RegisterMatch signal lines may provide a signal which indicates if the provided. information X_Compare exactly matches the data stored in the associated CAM cell register 420. The RegisterMatch signal line may carry voltage which may represent a logical level of a match bit, and the match bit may be at a logical high (e.g., a first voltage) if the information X_Compare matches the contents of the CAM cell register 420 associated with the respective RegisterMatch signal line. If there are one or more bits of X_Compare which do not match the data stored in the CAM Cell Register 420, then the respective signal line RegisterMatch may be at a second voltage which represents the match bit being at a low logical level.

After a compare operation, the states of RegisterMatch (0-m) may be used to determine which of the CAM cell registers 420 contain an exact match for X_Compare. For example, if each of the CAM cell registers is associated with a physical location, then that location may be accessed if the associated signal line RegisterMatch is at the first voltage (e.g., the match bit is at a high logical level).

An example environment where CAM cells, registers, and stacks of the present disclosure may be useful are semiconductor memory devices. Memory devices may be used to store one or more bits of information in a memory cell array, which contains a plurality of memory cells each of which includes one or more bits of information. The memory cells may be organized at the intersection of rows (word lines) and columns (bit lines). During various operations, the memory device may access one or more memory cells along specified word lines or bit lines by providing a row and/or column address which specifies the word line(s) and bit line(s). There may be memory operations where the CAM cell, register, and stack (e.g., as described in FIGS. 1-4) of the present disclosure are useful for comparing a row and/or column address to a row and/or column address stored in the CAM cell stack.

One example application are memory repair operations in a memory device. One or more of the memory cells of the memory device may become defective. The row and/or column address associated with the defective memory cell(s) may be reassigned to a redundant row/column of the memory array. This may be done, for example, by changing the state(s) of one or more fuses (and/or anti-fuses) in a fuse array. The state of the fuses may represent a row/column address to be repaired, which may be broadcast out to a fuse latch which is associated with the redundant row/column. When the memory attempts to access the repaired row/column, if the incoming row/column address matches the row/column address stored in the fuse latch, then the redundant row/column associated with that fuse latch is accessed instead of the defective row/column. The CAM cell registers (e.g., 300 of FIG. 3) may be used as the fuse latches and the match bit may be used to determine if the incoming row/column address is an exact match for the row/column address stored in the fuse latch.

Another example application for the CAM cells, registers, and stacks of the present disclosure are refresh operations in a memory device. Information in the memory cells may decay over time, and may need to be periodically refreshed (e.g., by rewriting the original value of the information to the memory cell). Repeated access to a particular row of memory (e.g., an aggressor row) may cause an increased rate of decay in neighboring rows (e.g., victim rows) due, for example, to electromagnetic coupling between the rows. This may generally be referred to as 'hammering' the row, or a row hammer event. In order to prevent information from being lost due to row hammering, it may be necessary to identify aggressor rows so that the corresponding victim rows can be refreshed (a 'row hammer refresh' or RHR). The row addresses of accessed rows may be stored and may be compared to new row addresses to determine if one or more rows requires an RHR operation. A CAM cell stack (e.g., 400 of FIG. 4) may be used to store accessed addresses and the respective match bits may be used to determine if an incoming row address matches any of the row addresses stored in the CAM cell stack. This may allow accesses to rows to be counted, in order to determine if they are being hammered.

Figure 5:
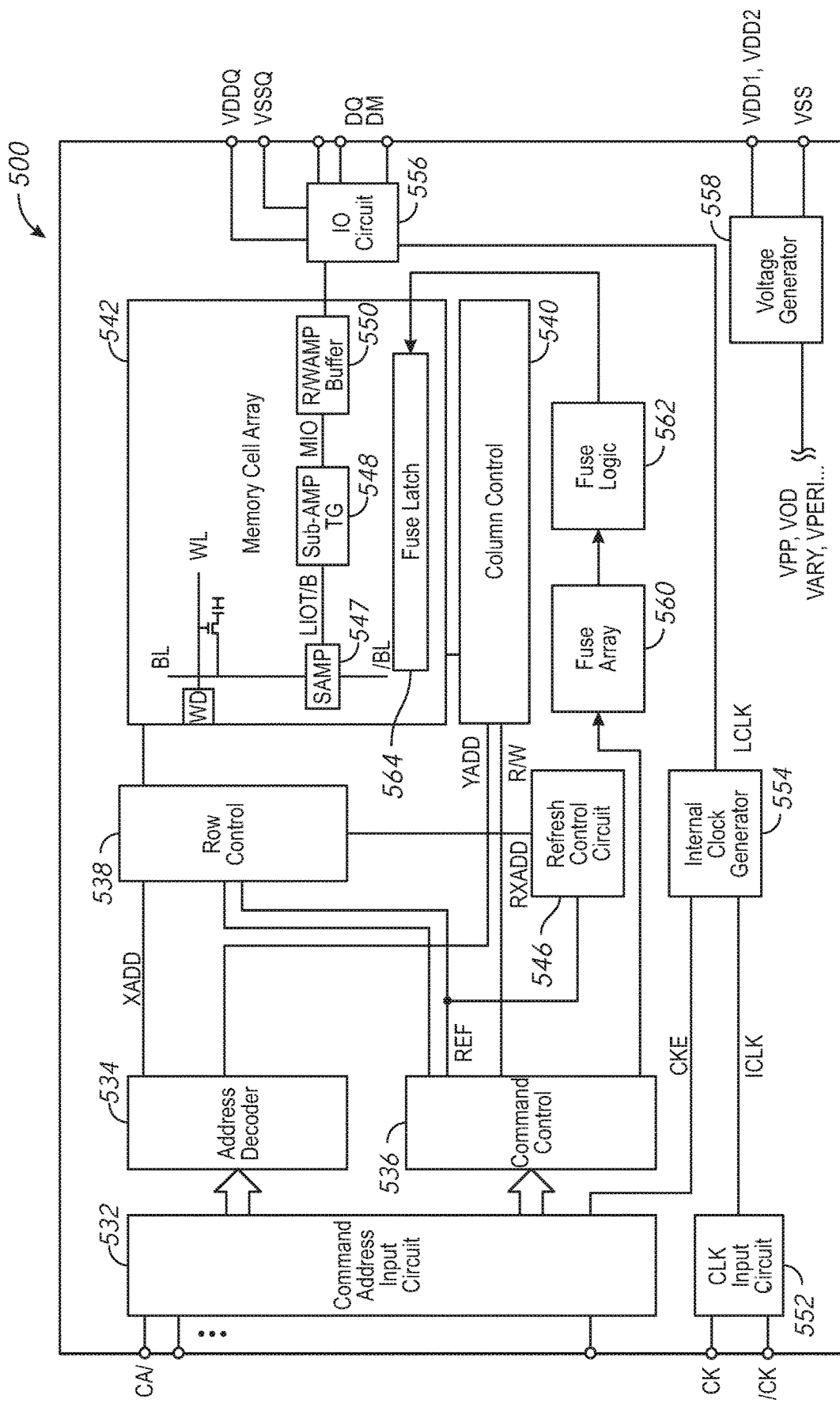
FIG. 5 is a block diagram of a semiconductor device according to at least one embodiment of the disclosure.

FIG. 5 is a block diagram of a semiconductor device according to at least one embodiment of the disclosure. The semiconductor device 500 may be a semiconductor memory device, such as a DRAM device integrated on a single semiconductor chip. The semiconductor device 500 may include one or more CAM cells (e.g., CAM cell 100 and/or 200 of FIGS. 1-2, CAM cell register 300 of FIG. 3, and/or CAM cell stack 400 of FIG. 4).

The semiconductor device 500 includes a memory array 542. In some embodiments, the memory array 542 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control 534 and the selection of the bit lines BL and /BL is performed by a column control 540. The bit lines BL and /BL are coupled to a respective sense amplifier (SAMP). Read data from the bit line BL or /BL is amplified by the sense amplifier SAMP 547, and transferred to read/write amplifiers 550 over complementary local data lines (LIOT/B), transfer gate (TG) 548, and complementary main data lines (MIO). Conversely, write data outputted from the read/write amplifiers 550 is transferred to the sense amplifier 547 over the complementary main data lines MIO, the transfer gate 548, and the complementary local data lines LIOT/B, and written in the memory cell MC coupled to the bit line BL or /BL.

The semiconductor device 500 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 552. The external clocks may be complementary. The clock input circuit 552 generates an internal clock ICLK based on the CK and /CK clocks. The ICLK clock is provided to the command control 536 and to an internal clock generator 554. The internal clock generator 554 provides various internal clocks ICLK based on the ICLK clock. The LCLK clocks may be used for timing operation of various internal circuits. The internal data clocks LCLK are provided to the input/output circuit 556 to time operation of circuits included in the input/output circuit 556, for example, to data receivers to time the receipt of write data.

The C/A terminals may be supplied with memory addresses. The memory addresses supplied to the C/A terminals are transferred, via a command/address input circuit 532, to an address decoder 534. The address decoder 534 receives the address and supplies a decoded row address XADD to the row control 534 and supplies a decoded column address YADD to the column control 540. The address decoder 534 may also supply a decoded bank address BADD, which may indicate the bank of the memory array 548 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command control 536 via the command/address input circuit 532. The command control 536 includes circuits to decode the internal command signals to generate various internal signals and commands for performing operations. For example, the command control 536 may provide a row command signal to select a word line and a column command signal to select a bit line.

The device 500 may receive an access command which is a row activation command ACT. When the row activation command ACT is received, a bank address BADD and a row address XADD are timely supplied with the row activation command ACT.

The device 500 may receive an access command which is a read command. When a read command is received, a bank address and a column address are timely supplied with the read command, read data is read from memory cells in the memory array 542 corresponding to the row address and column address. The read command is received by the command control 536, which provides internal commands so that read data from the memory array 542 is provided to the read/write amplifiers 550. The read data is output to outside from the data terminals DQ via the input/output circuit 556.

The device 500 may receive an access command which is a write command. When the write command is received, a bank address and a column address are timely supplied with the write command, write data supplied to the data terminals DQ is written to a memory cells in the memory array 542 corresponding to the row address and column address. The write command is received by the command control 536, which provides internal commands so that the write data is received by data receivers in the input/output circuit 556. Write clocks may also be provided to the external clock terminals for timing the receipt of the write data by the data receivers of the input/output circuit 556. The write data is supplied via the input/output circuit 556 to the read/write amplifiers 550, and by the read/write amplifiers 550 to the memory array 542 to be written into the memory cell MC.

One example application for the CAM cells described in the present disclosure are as the fuse latches 564 associated with redundant wordlines (.and/or redundant bit lines) of the memory array 542. While repair operations may generally be described with respect to redundant rows and row latches) it should be understood that redundant columns (and column latches) may operate in a similar fashion.

The fuse latches 564 may be used as part of a repair operation. During a repair operation, a memory address which previously was associated with a defective row of memory may be reassigned so that it is associated with one of the redundant wordlines instead. The repair operations may be performed by 'blowing' one or more fuses (and/or anti-fuses) of a fuse array 560. The fuse array 560 may include a number of fuses, each of which may have a state which represents a hit, The states of one or more fuses may be permanently changed (blown) to program in a particular piece of binary data. During a repair operation, an address to be repaired may be programmed into the fuse array 560 by blowing fuses.

Each redundant wordline and/or redundant bitline) may be associated with a fuse latch 564. The state of fuses in the fuse array 560 may be provided along a fuse bus. A fuse logic circuit 562 may provide a select signal (e.g., a write signal) which causes a repaired address represented by the values of the fuses in the fuse array 560 to be stored in a fuse latch 564. When the memory performs an access operation, the row address XADD may be compared to the addresses in the fuse latches 564, and if there is a match, the access operation may be performed on the redundant row associated with the fuse latch 564 instead of the original wordline that the address referred to. In this manner, the repaired address may be redirected to a redundant row.

Each of the fuse latches 564 may be CAM cell register such as the CAM cell register 300 of FIG. 3. If any addresses have been repaired, the fuse array 560 may provide row addresses along the fuse bus, and the fuse logic 562 may provide select signals (which may act as the signal Write of FIGS. 1-2) to allow the bits of the repaired address to be written in the CAM cells of the fuse latch 564 as the stored bits Q and QF (e.g., the bits of the repaired address may be the input bits D and DF). In some embodiments, one or more inverter circuits may be used to generate the inverse input bits DF based on the input bits D provided along the fuse bus.

When a row address XADD is provided, it may act as the external data X_Compare (e.g., of FIGS. 3-4) and the fuse latch may change the value of a match bit if any of the external data bits do not match the respective stored bits. If the match bit remains high, it may indicate that the row address XADD matches the address stored in the fuse latch 564, and an access operation may be performed on the associated redundant wordline.

Another example application for the CAM cells described in the present application include tracking aggressor addresses in order to refresh victim wordlines associated with those aggressor addresses The device 500 may also receive commands causing it to carry out refresh operations. The refresh signal AREF may be a pulse signal which is activated when the command control 536 receives a signal which indicates a refresh mode. In some embodiments, the refresh command may be externally issued to the memory device 500. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh control circuit 546. The refresh control circuit 546 supplies a refresh row address RXADD to the row control 534, which may refresh a wordline WL indicated by the refresh row address RXADD. The refresh control circuit 546 may control a timing of the refresh operation, and may generate and provide the refresh address RXADD. The refresh control circuit 546 may be controlled to change details of the refreshing address RXADD (e.g., how the refresh address is calculated, the timing of the refresh addresses), or may operate based on internal logic.

The memory device 500 may perform two types of refresh operations, auto-refresh operations and targeted refresh operations. Auto-refresh operations may involve refreshing the different wordlines of the memory array 542 in a sequence such that each wordline is refreshed at least once in a period based on an expected rate of decay of the information in the memory cell. The refresh control circuit 546 may provide refresh addresses RXADD from a sequence of refresh addresses. In some embodiments, a refresh address RXADD associated with an auto-refresh operation may cause multiple wordlines of the memory array 542 to be simultaneously refreshed.

Targeted refresh operations may be used to refresh the victim wordlines of identified aggressor wordlines. In some embodiments, refresh operations which would have normally been used for auto-refresh operations may be 'stolen' and used for targeted refresh operations instead. The victim wordlines may be physically near the aggressor wordline. For example, in some embodiments, the victim wordlines may include the wordlines which are physically adjacent to the aggressor wordline (e.g., R+1 and R−1). In some embodiments, the victim wordlines may include the wordlines which are adjacent to the adjacent wordlines (e.g., R+2 and R−2).

In order to perform targeted refresh operations, the aggressor wordlines must be identified, based on the access patterns to the wordlines. The refresh control circuit 546 may store row addresses XADD in a CAM register stack (e.g., the CAM register stack 400 of FIG. 4). Each CAM cell register may store a row address XADD. Incoming row addresses may be compared to the previously stored row addresses to determine if a particular row is being frequently accessed. In some embodiments, each register in the stack may be associated with a count value, which may be used to track a number of accesses to the row address stored in the associated register. Once an aggressor has been identified, one or more victim addresses may be calculated based on the aggressor address and then provided as the refresh address RXADD.

The power supply terminals are supplied with power supply potentials VDD and VSS. The power supply potentials VDD and VSS are supplied to an internal voltage generator circuit 558. The internal voltage generator circuit 558 generates various internal potentials VPP, VOD, VARY, VPERI, and the like based on the power supply potentials VDD and VSS supplied to the power supply terminals. The internal potential VPP is mainly used in the row control 534, the internal potentials VOD and VARY are mainly used in the sense amplifiers SAMP included in the memory array 542, and the internal potential VPERI is used in many peripheral circuit blocks.

The power supply terminals are also supplied with power supply potentials VDDQ and VSSQ. The power supply potentials VDDQ and VSSQ are supplied to the input/output circuit 556. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 556 so that power supply noise generated by the input/output circuit 556 does not propagate to the other circuit blocks.

Figure 6:
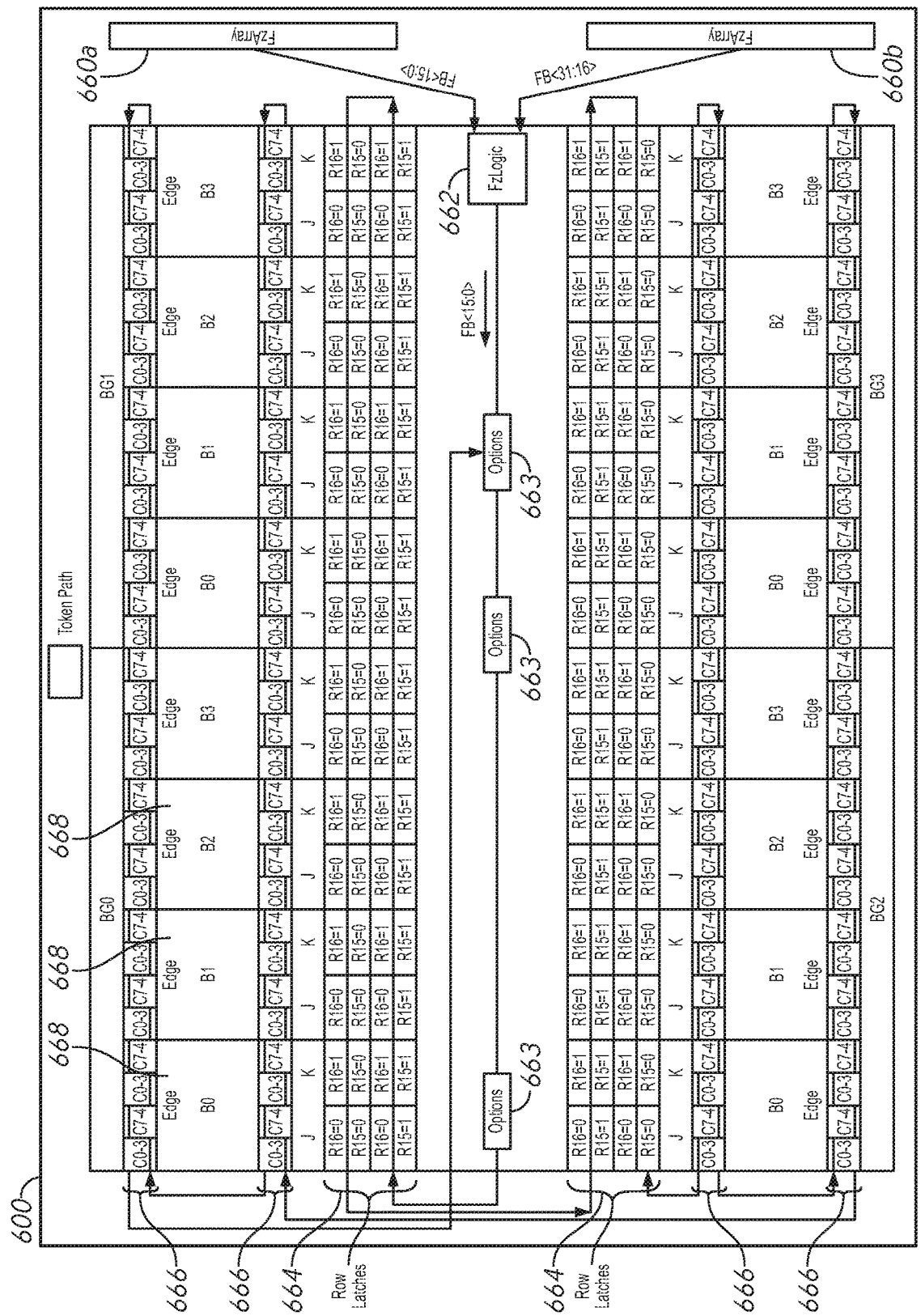
FIG. 6 is a block diagram of a memory array according to an embodiment of the present disclosure.

FIG. 6 is a block diagram of a memory array according to an embodiment of the present disclosure. FIG. 6 shows an example environment where the CAM cells of the present disclosure may be used in order to implement fuse latches (e.g., fuse latches 564 of FIG. 5). FIG. 6 shows the transmission path of a fuse bus from a pair of fuse arrays 560*a* and 560*b* through a memory array 600. In some embodiments, the memory array 600 may be an implementation of the memory array 542 of FIG. 1. The memory array 200 includes 16 banks 668. The 16 banks 668 are organized into four bank groups (BG0-BG3) of four banks 668 each. Each of the banks 668 is associated with fuse latches such as a set of row latches 664 and column latches 666. The row latches 664 and column latches 666 may implement of the fuse latches 564 of FIG. 5. Each of the row latches 664 and/or column latches 666 may include the CAM cell register 300 of FIG. 3.

Each row latch 664 and column latch 666 may be associated with a respective redundant row or column of memory. Each row latch 664 and column latch 666 may be a CAM cell register, with a plurality of CAM cells. The row latches 664 may have a number of CAM cells equal to a number of bits in a row address, while the column latches 666 may have a number of CAM cells equal to a number of bits in a column address. Taking the operation of a row latch 664 as an example, the row latch may receive a repaired row address from the fuse arrays 660*a-b* along a fuse bus. The row address may be accompanied by a select signal, which may act as write signals for the CAM cells of the row latch 664. Each bit of the row address may be stored in the latch portion (e.g., latch portion 102 of FIG. 1 or 202 of FIG. 2) of a respective one of the CAM cells. Each bit of the row address may be accompanied by a portion of the select signal which acts as a write signal for the CAM cell which will store that bit.

The row latches 664 may receive an incoming row address XADD in common. In some embodiments, only some of the row latches 664 (e.g., the row latches 664 of a given bank) may receive the row address XADD in common. The row latches 664 which receive the row address may compare the row address to the address stored in the row latch 664. For example, each row latch 664 may be coupled to a signal line which may carry a voltage associated with the value of a match bit (e.g., the signal line RegisterMatch of FIG. 3). A driver circuit (e.g., 316 of FIG. 3) may precharge the signal line to a voltage associated with a high logical level before the row address is compared. Each CAM cell of a given row latch 664 may compare a bit of the row address with the stored bit, and may change the voltage of the signal line if there is not a match. In this manner, the signal line may only stay at the first voltage (e.g., a high logical level) if all of the bits of the address match all of the bits of the row address. The row associated with the row latch 664 may only be accessed when the signal line remains at a high logical level.

A fuse bus may be used to provide addresses from the fuse arrays 660*a-b* to the row latches 664 and column latches 666. In the particular embodiment of FIG. 6, there may be a pair of fuse arrays 660*a* and 660*b*. The fuse array 660*a* may include a set of fuses and/or anti-fuses which may generally be used to store address information for a first portion of row addresses. The fuse array 660*b* may include a set of fuses and/or anti-fuses which may generally be used to store address information for a second portion of row addresses. In some embodiments, the row addresses may be divided between the first portion and the second portion based on a numerical value assigned to the address.

The fuse arrays 660*a-b* may include groups of fuses which can be used to record memory addresses for repair. For example, when a defective memory row is identified, the address associated with the defective row may be programmed into one of the fuse arrays 660*a-b* by blowing one or more fuses. The group of fuses which were blown may be associated with a particular row of redundant memory. During a broadcast operation, the fuse arrays 660*a-b* may broadcast the row addresses stored in the fuse arrays 660*a-b* along the fuse bus. In some embodiments, the fuse logic circuit 662 may receive addresses from both the fuse arrays 660*a-b*, and may alternate providing addresses from the first fuse array 660*a* and the second fuse array 660*b* along the fuse bus to the row latches 664 and column latches 666.

After leaving the fuse logic circuit 662, the fuse bus may pass data through one or more options circuits 663. The options circuits 663 may include various settings of the memory which may interact with the addresses along the fuse bus. For example, the options circuits 663 may include fuse settings, such as the test mode and power supply fuses. Data stored in the fuse arrays 660*a-b* may be latched and/or read by the options circuits 663, which may then determine one or more properties of the memory based on the options data provided along the fuse bus.

After passing through the options circuits 663 the fuse bus may pass through the row latches 664 for all of the memory banks 668 before passing through the column latches 666 for all of the memory banks 668. As well as providing data (including address data) along the fuse bus, the fuse logic circuit 662 may also provide one or more select signals along the fuse bus. The select signals may be associated with a particular packet of data along the fuse bus, and may determine which circuit along the fuse bus the particular packet of data is associated with. The select signals may act as the Write signal described in FIGS. 1-2 and may allow the data to be written to latch portion of the row latch 664 or column latch 666 associated with the select signal. For example, if a row latch select signal is in an active state, it may indicate that the packet of data is to be stored in a row latch 664. In some embodiments, this may overwrite an address already stored in the row latch 664 with the address from the fuse bus. Further select signals may be used to specify a particular location of the specific row latch 664 which is intended to store the packet of data (e.g., a bank group select signal, a bank select signal, etc.).

Figure 7:
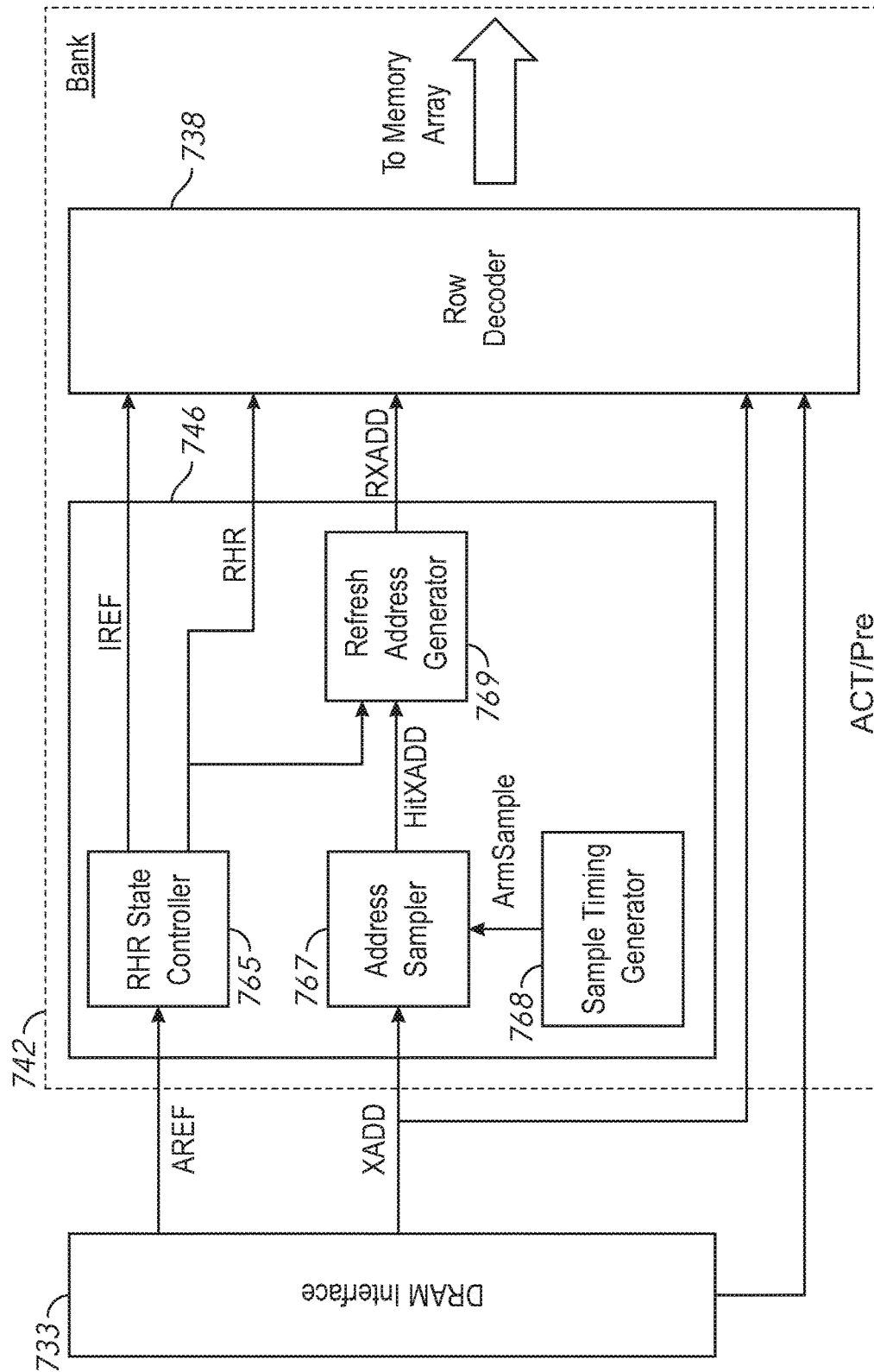
FIG. 7 is a block diagram of a refresh control circuit according to an embodiment of the present disclosure.

FIG. 7 is a block diagram of a refresh control circuit according to an embodiment of the present disclosure. FIG. 7 shows an example application for the CAM cells of the present disclosure as a way of tracking accesses to wordlines of a memory in order to detect row hammer events. In some embodiments, the refresh control circuit 746 may implement the refresh control circuit 546 of FIG. 5. The dotted line 742 is shown to represent that in certain embodiments, each of the components (e.g., the refresh control circuit 746 and row control 738) may correspond to a particular bank of memory, and that these components may be repeated for each of the banks of memory. Thus, there may be multiple refresh control circuits 746 and row controls 738. For the sake of brevity, only components for a single bank will be described.

A DRAM interface 733 may provide one or more signals to an address refresh control circuit 746 and row control 738. The refresh control circuit 746 may include a sample signal generator 768, an address sampler 767, a row hammer refresh (MIR) state controller 765 and a refresh address generator 769. The DRAM interface 733 may represent one or more components of a memory device (e.g., device 500 of FIG. 5) which provide one or more control signals, such as an auto-refresh signal AREF, and a row address XADD to the refresh control circuit 746 and/or row control 738. The sample signal generator 768 generates a sampling signal ArmSample with random timing.

The address sampler 767 may sample (e.g., latch) the current row address XADD responsive to an activation of ArmSample. The address sampler 767 may also provide one or more of the latched addresses to the refresh address generator 769 as the matched address HitXADD. The address sampler 767 may include a CAM register stack (e.g., CAM register stack 400 of FIG. 4), which may be used to count accesses to different row addresses XADD.

The RHR state controller 765 may provide the signal MIR to indicate that a row hammer refresh (e.g., a refresh of the victim rows corresponding to an identified aggressor row) should occur. The RHR state controller 765 may also provide an internal refresh signal IREF, to indicate that an auto-refresh should occur. Responsive to an activation of RHR, the refresh address generator 769 may provide a refresh address RXADD, which may be an auto-refresh address or may be one or more victim addresses corresponding to victim rows of the aggressor row corresponding to the match address HitXADD. The row control 738 may perform a refresh operation responsive to the refresh address RXADD and the row hammer refresh signal RHR. The row control 738 may perform an auto-refresh operation based on the refresh address RXADD and the internal refresh signal IREF.

The DRAM interface 733 may represent one or more components which provides signals to components of the bank. For example, the DRAM interface 733 may represent components such as the command address input circuit 532, the address decoder 534, and/or the command decoder 536 of FIG. 5. The DRAM interface 733 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal including multiple bits (which may be transmitted in series or in parallel) and may correspond to a specific row of an activated memory bank.

The sample signal generator 768 provides the sampling signal ArmSample. The address sampler 767 may receive the row address XADD from the DRAM interface 733 and. ArmSample from the sample signal generator 768. The row address XADD may change as the DRAM interface 733 directs access operations (e.g., read and write operations) to different rows of the memory cell array (e.g., memory cell array 542 of FIG. 9). Each time the address sampler 767 receives an activation (e.g., a pulse) of ArmSample, the address sampler 767 may sample the current value of XADD and may save the current value of XADD in a CAM register of a CAM stack.

The address sampler 767 may determine if one or more rows is an aggressor row based on the sampled row address XADD, and may provide the identified aggressor rows as the match address HitXADD. As part of this determination, the address sampler 767 may record (e.g., by latching and/or storing in a register) the current value of XADD responsive to the activation of ArmSample. The current value of XADD may be compared to previously recorded addresses in the address sampler 767 (e.g., the addresses stored in the latch/register), to determine access patterns over time of the sampled addresses. If the address sampler 767 determines that the current row address XADD is being repeatedly accessed (e.g., is an aggressor row), the activation of ArmSample may also cause the address sampler 767 to provide the address of the aggressor row as a match address HitXADD. In some embodiments, the match address (e.g., aggressor address) HitXADD may be stored in a latch circuit for later retrieval by the refresh address generator 769.

The address sampler 767 may store the value of sampled addresses in a CAM cell register of a CAM stack (e.g., CAM register stack 420 of FIG. 4), and may have a counter associated with each of the stored addresses. When ArmSample is activated, if the current row address XADD matches one of the stored addresses, the value of the counter may be incremented. Responsive to the activation of ArmSample, the address sampler 767 may provide the address associated with the highest value counter as the match address HitXADD. Other methods of identifying aggressor addresses may be used in other examples.

The RHR state controller 765 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 765 may use internal logic to provide the RHR signal. In some embodiments, the RHR state controller 765 may provide the RHR signal based on certain number of activations of AREF (e.g., every $4^{th}$ activation of AREF). The RHR state controller 765 may also provide an internal refresh signal IREF, which may indicate that an auto-refresh operation should take place. In some embodiments, the signals RHR and IREF may be generated such that they are not active at the same time (e.g., are not both at a high logic level at the same time).

The refresh address generator 769 may receive the row hammer refresh signal RHR and the match address HitXADD. The match address HitXADD may represent an aggressor row. The refresh address generator 769 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 769 may determine the value of the refresh address RXADD based on the row hammer refresh signal RHR. In some embodiments, when the signal RHR is not active, the refresh address generator 769 may provide one of a sequence of auto refresh addresses. When the signal RHR is active, the refresh address generator 1092 may provide a targeted refresh address, such as a victim address, as the refresh address RXADD.

The row control 738 may perform one or more operations on the memory array (not shown) based on the received signals and addresses. For example, responsive to the activation signal ACT and the row address XADD (and IREF and RHR being at a low logic level), the row control 738 may direct one or more access operations (for example, a read operation) on the specified row address XADD. Responsive to either (or both) of the RHR or IREF signals being active, the row control 738 may refresh the refresh address RXADD.

Figure 8:
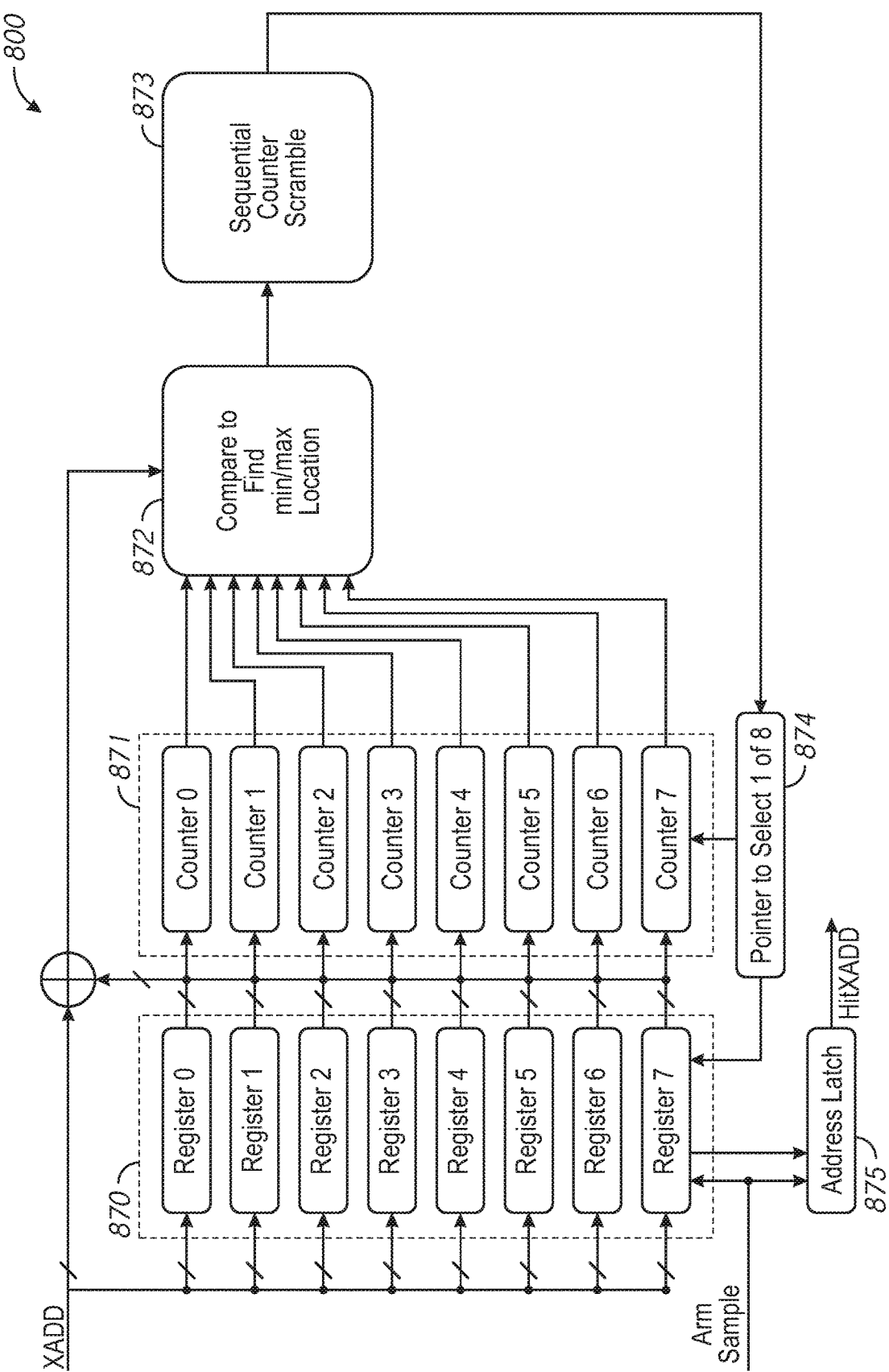
FIG. 8 is a block diagram of an address sampler according to an embodiment of the present disclosure.

FIG. 8 is a block diagram of an address sampler according to an embodiment of the present disclosure. In some embodiments, the address sampler 800 may be used to implement the address sampler 767 of FIG. 7. The address sampler 800 includes a CAM register stack 870 which may be the CAM register stack 400 of FIG. 4. The address sampler 800 may include CAM register stack 870, each of which may have a corresponding counter 871. The counters 871 may be coupled to a comparator 872 which may be coupled to a pointer 874 through a counter scrambler 873. The registers 870 may be coupled to an address latch 875, which may store and provide an identified row hammer address as the match address HitXADD.

The address sampler 800 may sample a current row address XADD responsive to the sample signal ArmSample. The sample signal ArmSample may also cause the address sampler 800 to determine if a sampled address (e.g., an address stored in one of the registers 870) is a row hammer address and store it on the address latch 875, where it can be provided to a refresh address generator (e.g., refresh address generator 769 of FIG. 7) as the match address HitXADD.

Each time the sample signal Arm Sample is provided, the current row address XADD may be compared to the addresses stored in the CAM register stack 870. The current row address XADD may be provided as the external data X_Compare (e.g., as in FIGS. 3-4) to each of the CAM registers of the CAM register stack 870. Each of the CAM registers of the CAM register stack 870 may provide a match bit which indicates if the row address XADD is an exact match to the address already stored in each of the CAM registers.

If the current address XADD is already stored in one of the registers (e.g., if at least one of the match bits is at a high logical level), then the counter 871 associated with that register 870 may be incremented. If the current address XADD is not already stored in one of the CAM cell registers of the stack 870 if all of the match bits are at a low logical level), it may be added to one of the registers of the CAM register stack 870. If there is an open CAM cell register (e.g., a register without a latched address) then the sampled address XADD may be stored in the open register. If there is not an open register, then the register associated with the counter 871 which has the lowest value (as indicated by the pointer 874) may have its latched address replaced with the sampled address XADD. In either case, the row address XADD may be provided along with a write signal (e.g., the signal Write of FIGS. 1-2) at a high logical level, which may cause the bits of the row address XADD to overwrite the data previous stored in the CAM cell register.

The ArmSample signal may also cause the comparator 872 to determine a counter 871 with a maximum and minimum value. These may be provided to a counter scrambler 873, which may match the maximum and minimum counter 871 to their respective associated registers 870. The pointer 874 may point to the CAM cell register of the CAM stack 870 associated with the maximum value of count in the counters 871 and may point to the CAM register stack 870 associated with the minimum value of count in the counters 871. The minimum pointer may be used to overwrite a register 870 when a new address XADD is sampled and there is no open register 870 to store it in. The signal ArmSample may cause the address stored in the CAM register stack 870 indicated by the maximum pointer to be stored in the address latch 875.

The address stored in the address latch 875 may be provided as the match address HitXADD. When a targeted refresh operation is carried out based on the address HitXADD, (e.g., when victim addresses associated with HitXADD are refreshed), the counter 871 associated with the refresh operation may be reset.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a latch circuit configured to store a first signal and a second signal, wherein the second signal is complementary the first signal, wherein the latch circuit is configured to receive a fifth signal and a sixth signal which is complementary to the fifth signal, and replace the first signal with the fifth signal and the second signal with the sixth signal when a write signal is active; and
    a comparator circuit configured to receive a third signal and a fourth signal, wherein the third signal is complementary to the fourth signal, the comparator circuit comprising:
        a first portion configured to activate as part of a comparison operation when the fourth signal is in a first logical level, and configured to, when active, couple a signal line to a voltage when the first signal is at the first logical level; and
        a second portion configured to activate as part of the comparison operation when the third signal is at the first logical level, and configured to, when active, couple the signal line to the voltage when the second signal is at the first logical level, wherein the signal line is driven to a second voltage different than the voltage before the comparison operation.

2. The apparatus of claim 1, wherein the latch circuit comprises a first write transistor coupled between the fifth signal and the first signal and a second write transistor coupled between the sixth signal and the second signal, wherein the first write transistor and the second write transistor have gates coupled in common to the write signal.

3. The apparatus of claim 1, wherein a logical state of the first signal represents a logical state of a bit stored by the latch circuit.

4. The apparatus of claim 1, wherein the latch circuit comprises a first plurality of transistors, all having a first size, and wherein the comparator circuit comprises a second plurality of transistors all having a second size different from the first size.

5. An apparatus comprising:
   a latch circuit configured to store a first signal and a second signal, wherein the second signal is complementary the first signal, the latch circuit further comprising:
      a first transistor configured to couple a first voltage to the first signal when the second signal is at a second logical level;
      a second transistor configured to couple the first voltage to the second signal when the first signal is at the second logical level;
      a third transistor configured to couple a second voltage to the first signal when the second signal is at the first logical level; and
      a fourth transistor configured to couple the second voltage to the second signal when the first signal is at the first logical level, wherein the first voltage is associated with the first logical level and the second voltage is associated with the second logical level; and
   a comparator circuit configured to receive a third signal and a fourth signal, wherein the third signal is complementary to the fourth signal, the comparator circuit comprising:
      a first portion configured to activate as part of a comparison operation when the fourth signal is in a first logical level, and configured to, when active, couple a signal line to a voltage when the first signal is at the first logical level; and
      a second portion configured to activate as part of the comparison operation when the third signal is at the first logical level, and configured to, when active, couple the signal line to the voltage when the second signal is at the first logical level, wherein the signal line is driven to a second voltage different than the voltage before the comparison operation.

6. The apparatus of claim 5, wherein the first portion of the comparator circuit comprises a fifth transistor and a sixth transistor coupled in series between the signal line and the first voltage, wherein the fifth transistor is activated by the first signal being at the first logical level and the sixth transistor is activated by the fourth signal being at the first logical level, and
   wherein the second portion of the comparator circuit comprises a seventh transistor and an eighth transistor coupled in series between the signal line and the first voltage, wherein the seventh transistor is activated by the second signal being at the first logical level and the eighth transistor is activated by the third signal being at the first logical level.

7. The apparatus of claim 1, wherein the signal line having the second voltage represents a match between the first and the third signals, and wherein the signal line having the voltage represents a mismatch between the first and the third signals.

* * * * *